United States Patent [19]
Onai et al.

[11] Patent Number: 5,324,983
[45] Date of Patent: Jun. 28, 1994

[54] SEMICONDUCTOR DEVICE

[75] Inventors: Takahiro Onai, Ome; Takeo Shiba, Kodaira; Tohru Nakamura, Mitaka; Yoichi Tamaki, Kokubunji; Katsuyoshi Washio, Tokorozawa; Kazuhiro Ohnishi; Masayoshi Saitoh, both of Hachioji, all of Japan

[73] Assignee: Hitachi, Ltd., Tokyo, Japan

[21] Appl. No.: 902,592

[22] Filed: Jun. 22, 1992

[30] Foreign Application Priority Data

Jun. 24, 1991 [JP] Japan .................. 3-151454

[51] Int. Cl.⁵ .................. H01L 27/082; H01L 27/102; H01L 29/00
[52] U.S. Cl. ..................... 257/586; 257/588; 257/587; 257/497
[58] Field of Search ............... 257/586, 588, 587, 497, 257/249, 384, 554

[56] References Cited

U.S. PATENT DOCUMENTS

| | | | |
|---|---|---|---|
| 4,531,282 | 7/1985 | Sakai et al. | 257/588 |
| 4,789,885 | 12/1988 | Brighton et al. | 257/588 |
| 4,933,737 | 6/1990 | Nakamura et al. | 357/59 |
| 4,949,162 | 8/1990 | Tamaki et al. | 357/35 |
| 4,963,957 | 10/1990 | Ohi et al. | 357/34 |

OTHER PUBLICATIONS

An Advanced High Performance Trench-Isolated Self-Aligned Bipolar Technology; Tak. H. Ning et al, Jan. 16, 1987 IEEE Tran on Elec Dev vol. Ed-34, No. 11, Nov. 1987.

*Primary Examiner*—William L. Sikes
*Assistant Examiner*—Fetsum Abraham
*Attorney, Agent, or Firm*—Antonelli, Terry, Stout & Kraus

[57] ABSTRACT

A first region of a first conductivity type is formed in the surface of a semiconductor body, and second and third regions of a second conductivity type are formed on and under, respectively, of the first region. An electrode region formed on a first insulating film formed on the semiconductor body is connected electrically to the first region. The electrode region is defined as having an elongated first part an upper surface of which is connected to an electrode, and having a second, different part which has a substantially constant width and which width is substantially equal to the thickness of the first portion of the electrode region. A metal silicide film is formed over the upper surface of the first portion of the electrode region. The first, second and third regions can be base, emitter and collector regions, respectively, of a bipolar transistor formed in an island region of an epitaxially grown layer on a semiconductor substrate.

31 Claims, 17 Drawing Sheets

PRESENT INVENTION

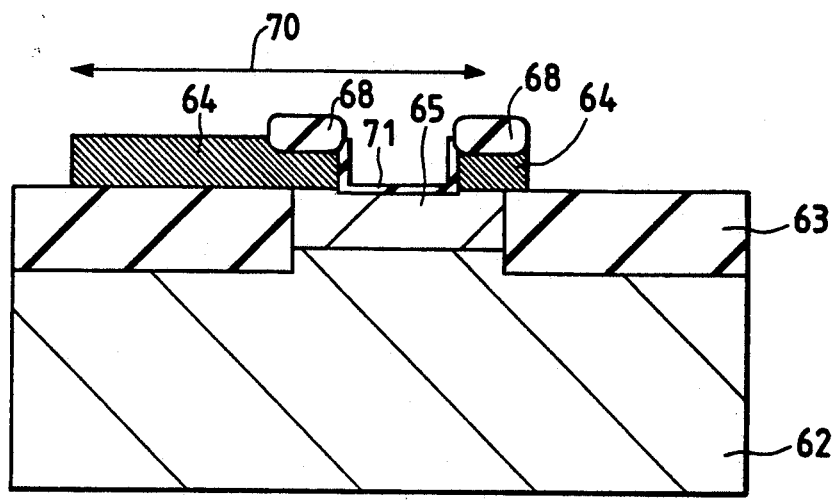
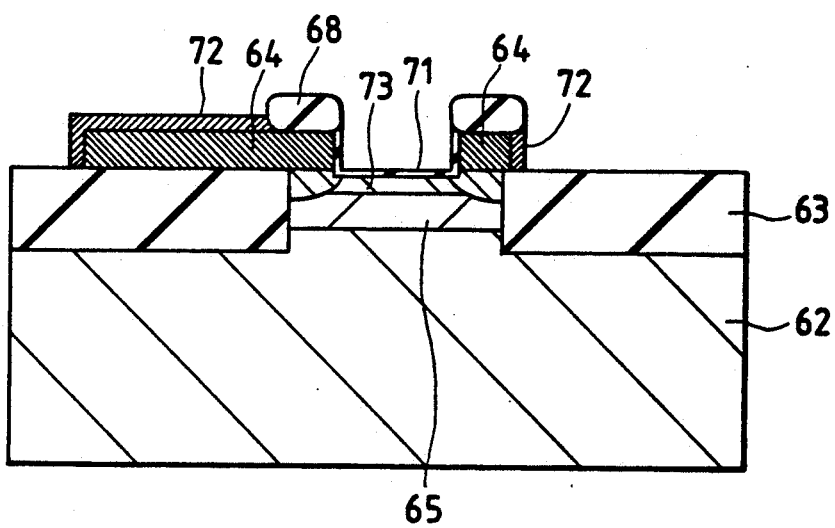

SEMICONDUCTOR DEVICE

BACKGROUND OF THE INVENTION

The present invention relates to a semiconductor device and, more particularly, to a bipolar transistor requiring a small area, having a small base resistance and particularly suitable for operation at a very high speed.

Referring to FIG. 1, showing a conventional bipolar transistor fabricated by a self-alignment technique, there are shown an n-type emitter region 11, a p-type base region 12, a heavily doped n-type collector region 5, a silicon dioxide film 14, a silicon dioxide film 15, an n-type polycrystalline silicon film 16, an emitter lead 17, a base (or base lead-out) lead 18 and a base electrode 19 formed of a p-type polycrystalline silicon film. The distance between the right-hand end of the p-type polycrystalline silicon film 19 and the right-hand end of the emitter region 11 must be not less than about 0.6 $\mu$m since the alignment error resulting during the formation of a base electrode 19 of polycrystalline silicon film by using photolithographic technique must be taken into consideration. As a result, therefore, reduction of this distance is limited by the alignment error in photolithographic technique. The base electrode 19 is formed of only polycrystalline silicon.

A bipolar transistor having such a structure is disclosed in IEEE, Trans. Electron Der., pp. 2246–2254, ED-34, No. 11 (1987).

Since the size of the base electrode 19 of this conventional bipolar transistor is limited by the accuracy of aligning the base electrode 19 relative to the n-type emitter region 11 in a photolithographic process, it has been difficult to reduce the size of the base electrode 19. Even if the size of the base electrode 19 could be reduced, the resistance of the base electrode 19 increases because the width of the base electrode 19 surrounding the emitter region 11 is reduced. Consequently, current is locally concentrated in a portion of the base electrode 19 in contact with the base lead 18, which deteriorates the high-frequency characteristics of the bipolar transistor.

The emitter region 11 must be formed in a smaller area to form the bipolar transistor in a compact construction. However, if the base electrode 19 is formed to have a relatively large thickness, the resistance, in a vertical direction of the polycrystalline silicon film 16 formed on the emitter region 11 increases. Therefore, the base electrode 19 must be formed in a relatively small thickness to make the resistance of the polycrystalline silicon film 16 in a vertical direction relatively small. The sheet resistance of a highly doped p-type polycrystalline silicon film which is of 500 nm in thickness and which is doped to a maximum impurity concentration is about 50 $\Omega/\square$. The sheet resistance is inversely proportional to the thickness of the polycrystalline silicon film; a polycrystalline silicon film of a smaller thickness has a greater sheet resistance. Accordingly, if the thickness of the base electrode 19 is reduced to prevent the increase of the resistance, in a vertical direction, of the polycrystalline silicon film 16 formed on the emitter region 11, the base series resistance of a narrow portion of the base electrode 19 increases, thereby reducing the operating speed.

SUMMARY OF THE INVENTION

Accordingly, it is an object of the present invention to provide a bipolar transistor provided with a base electrode having a low resistance and capable of being formed in a reduced area without increasing the base resistance.

A bipolar transistor according to one aspect of the present invention has an electrode region, for example, a base electrode, formed in self-alignment with respect to a first region, for example, a base region, or a second region, for example, an emitter region, and the electrode region is formed by disposing a metal silicide film at least on a portion of the upper surface and on the side surface of a polycrystalline silicon film.

As shown in FIG. 2, a base electrode 10 is formed of a polycrystalline silicon film on an insulating film 3 with at least its two sides in parallel to the two corresponding sides of a base region 4 and at equal distances smaller than a minimum possible interval which can be achieved by lithography from the corresponding sides of the base region 4, respectively, and a metal silicide film 9 is formed on the side surfaces of the sides of the base electrode 10 at equal distances from the corresponding sides of the base region 4 and on the surface of the base electrode 10 in contact with a metal electrode 8.

The base electrode 10 can be formed in a very small horizontal size by forming the base electrode 10 with at least its two sides self-aligning with the corresponding sides of the base region 4.

The metal silicide film formed on the side surfaces of the base electrode 10 reduces greatly the resistance of a portion of the base electrode 10 narrowed by the use of self-alignment.

For example, the sheet resistance of the base electrode 10 can be reduced to about 5 $\Omega/\square$ by forming the metal silicide instead of polycrystalline silicon. Thus, the base electrode can be formed in a reduced size without increasing its resistance. Particularly, when a metal silicide film is formed on the side surface of the base electrode made of a polycrystalsilicon film, the resistance of the base electrode hardly changes even if the width thereof is reduced and hence the base electrode having a small resistance and a small area can be formed.

BRIEF DESCRIPTION OF THE DRAWINGS

FIGS. 22 to 29 are sectional views of a completion of different processing steps of a method of fabricating a bipolar transistor in a third embodiment according to the present invention;

DETAILED DESCRIPTION OF THE PREFERRED EMBODIMENTS

First Embodiment

Figure 1:
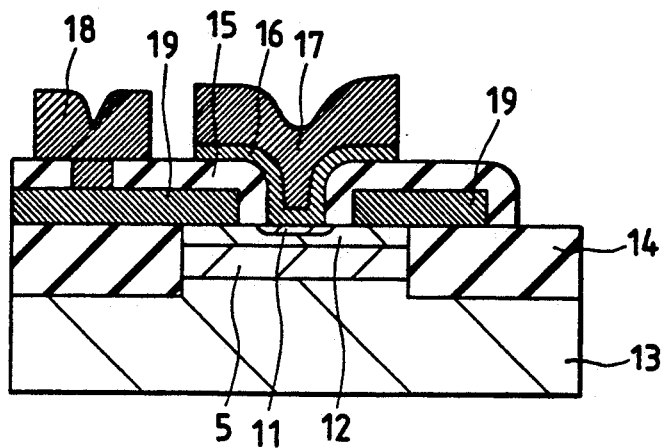
FIG. 1 is a fragmentary sectional view of a conventional bipolar transistor.
Figure 2:
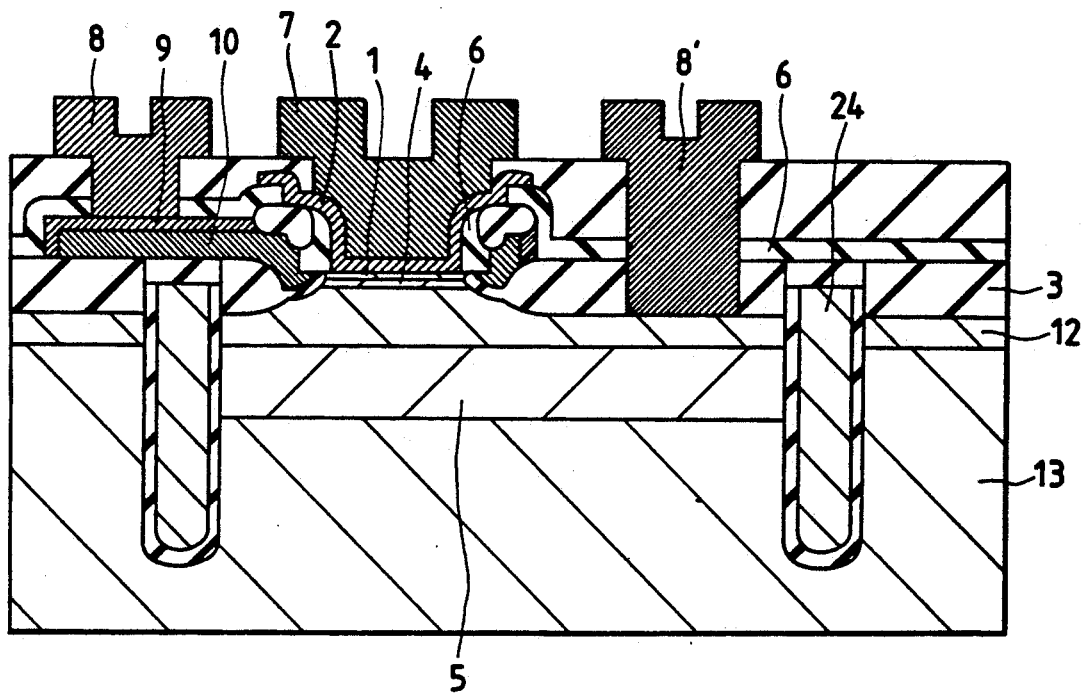
FIG. 2 is a sectional view of a bipolar transistor in a first embodiment according to the present invention.

A method of fabricating a bipolar transistor in a first embodiment according to the present invention shown in FIG. 2 will be described hereinafter with reference to FIGS. 3 to 13.

Figure 3:
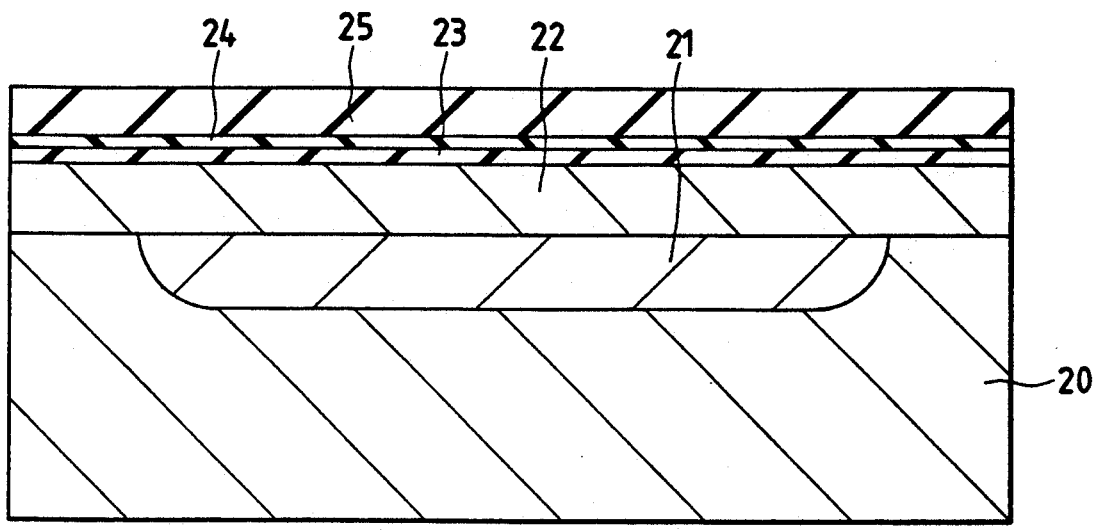
FIGS. 3 to 13 are sectional views of a completion of different processing steps of a method of fabricating the bipolar transistor shown in FIG. 2.
Figure 4:
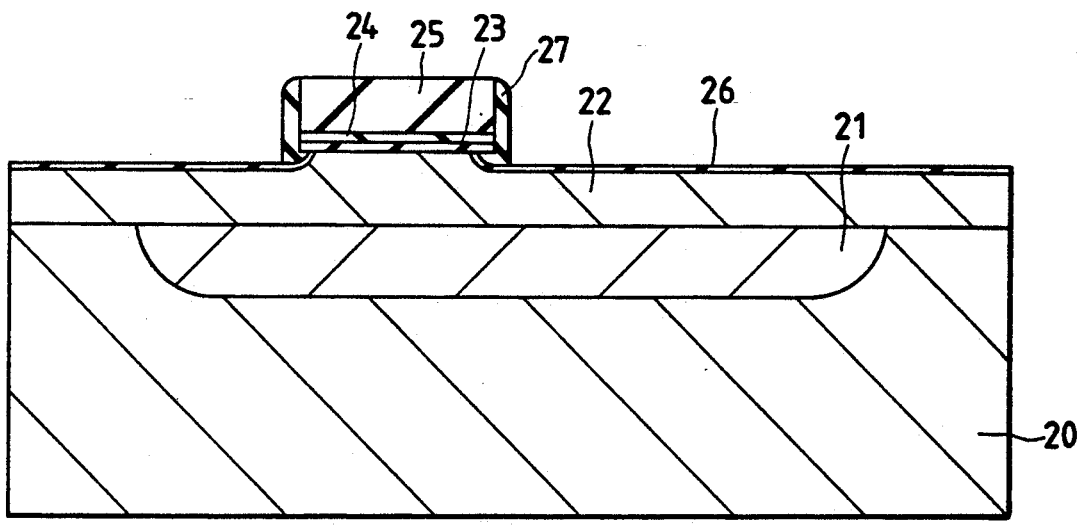

Referring to FIG. 3, antimony (Sb) is diffused selectively in a predetermined region in the surface of a lightly doped p-type silicon substrate 20 to form a heavily doped n-type layer 21 to be used as a heavily doped collector region. Then, an n-type epitaxial layer 22 is formed by a known epitaxial growth process over the entire surface of the p-type silicon substrate 20. Subsequently, a silicon dioxide film 23, a silicon nitride film 24 and a silicon dioxide film 25 are formed, in that order, over the p-type silicon substrate 20 by a known thermal oxidation process and a CVD process. The silicon dioxide film 23, the silicon nitride film 24 and the silicon dioxide film 25 are subsequently removed by etching, leaving a laminate structure consisting of necessary portions of the silicon dioxide film 23, the silicon nitride film 24 and the silicon dioxide film 25, as shown in FIG. 4. Then, the epitaxial layer 22 is etched by a depth of 0.1 $\mu$m using the laminate structure as a mask.

Figure 5:
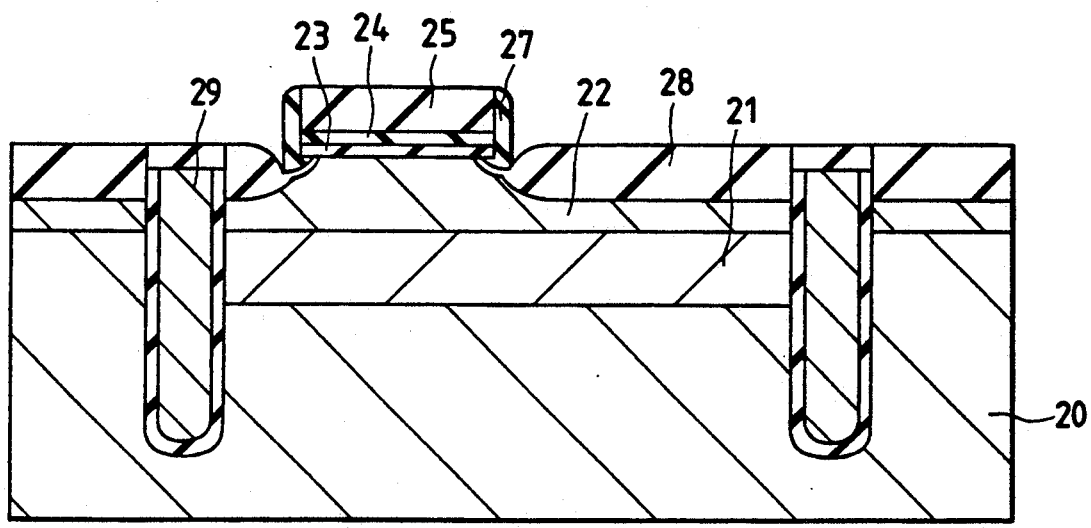

Then, an oxide film 26 of 20 nm in thickness is formed over the surface of the epitaxial layer 22 by a known thermal oxidation process. Then, the entire surface of the structure thus obtained is covered with a silicon nitride film 27, but however most of the silicon nitride film 27 is subsequently removed by anisotropic etching, leaving only portions thereof formed on the side surfaces of the laminate structure consisting of the silicon dioxide film 23, the silicon nitride film 24 and the silicon dioxide film 25. Then, the structure is subjected to a known thermal oxidation process to form a silicon dioxide film 28, and isolating grooves 29 for isolating elements are formed around the transistor region as shown in FIG. 5. The isolating grooves 29 are of a known construction having inner surfaces covered with an insulating film and filled up with polycrystalline silicon.

Figure 6:
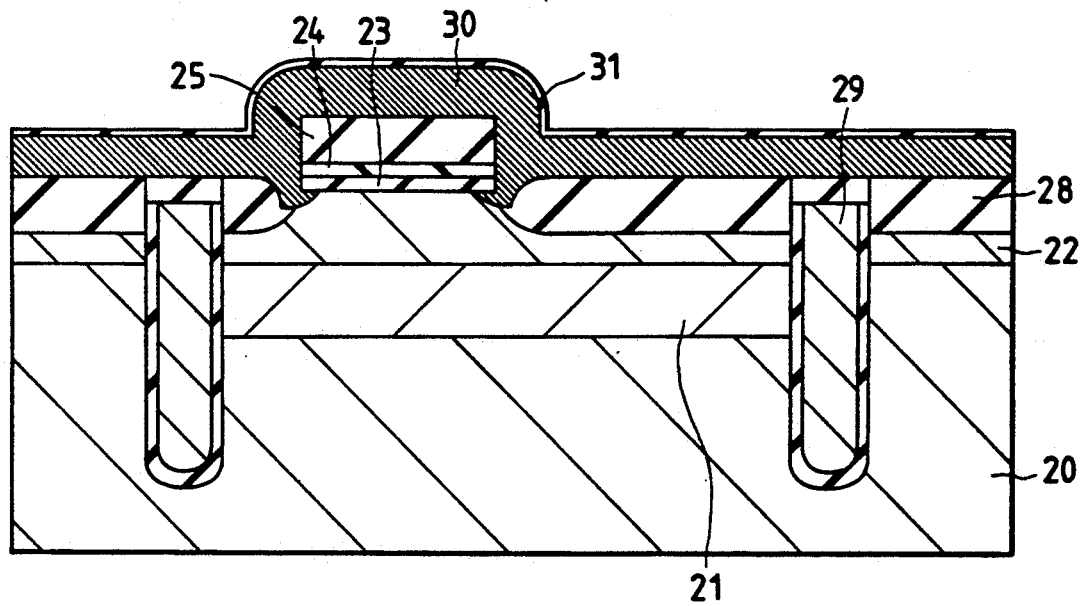
Figure 7:
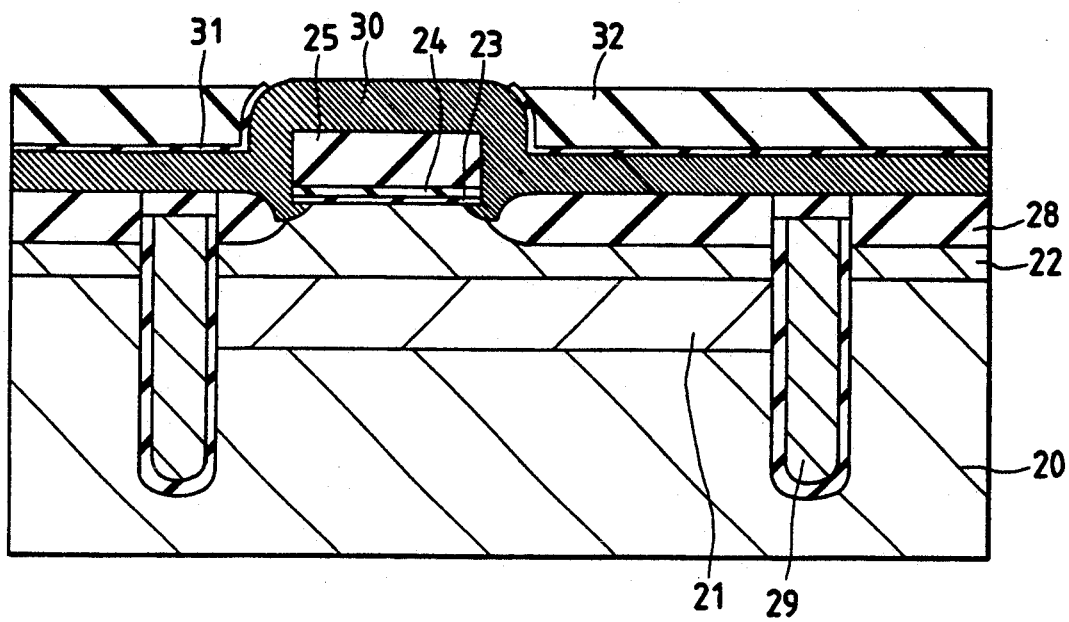
Figure 8:
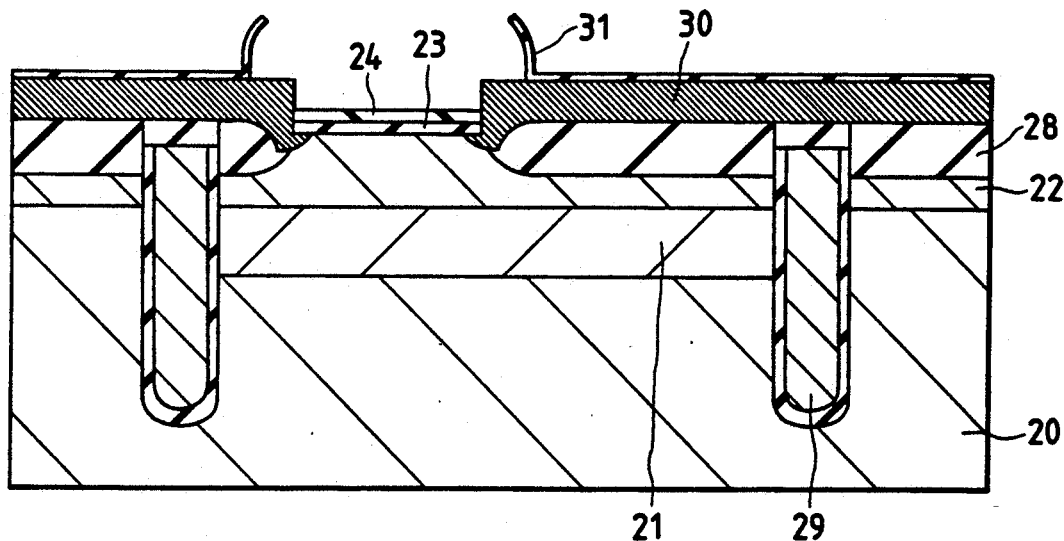
Figure 9:
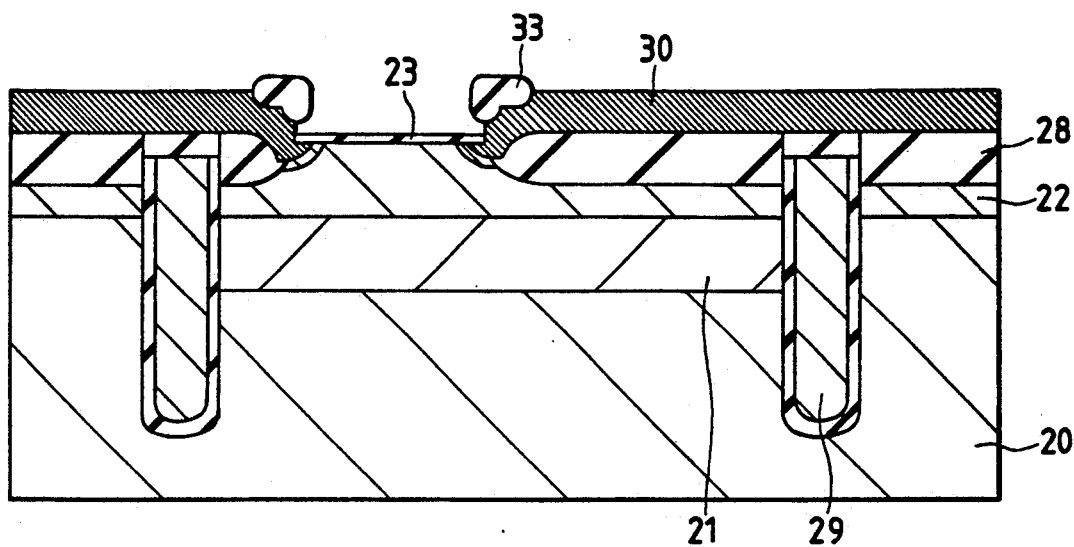
Figure 10:
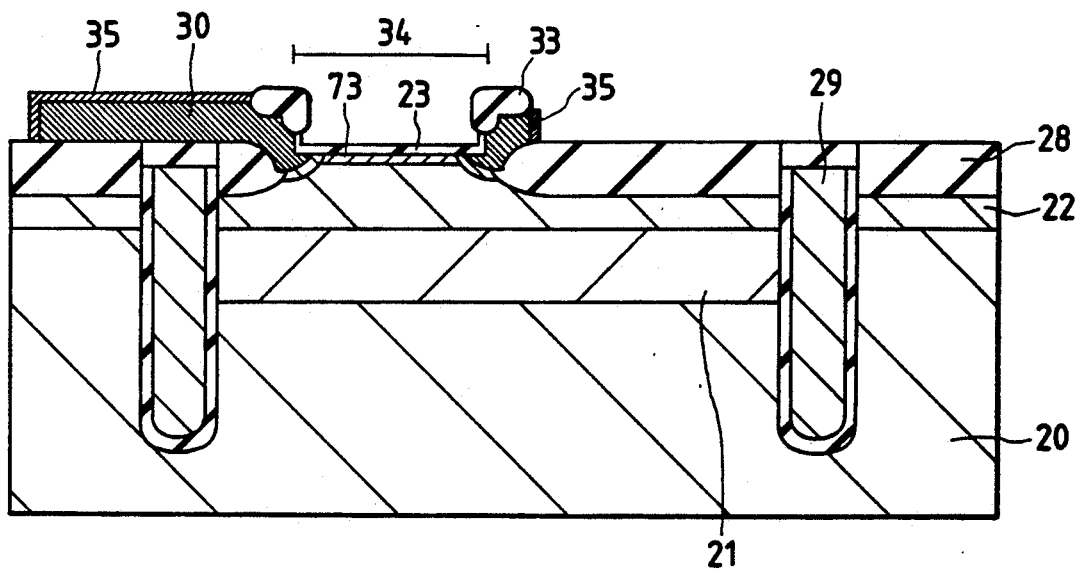

Then, as shown in FIG. 6, the silicon nitride film 27 is removed, a polycrystalline silicon film 30 is deposited in a thickness of 400 nm by a known CVD process over the surface of the structure and a silicon nitride film 31 is deposited over the surface of the polycrystalline silicon film 30. Then, boron (B) is implanted in the polycrystalline silicon film 30 to form a p-type polycrystalline silicon film 30. Then, the surface of the structure is coated with a resist film 32 and the resist film 32 is etched so that the surface of a portion of the silicon nitride film 31 corresponding to the laminate structure, consisting of the silicon dioxide film 23, the silicon nitride film 24 and the silicon dioxide film 25, becomes exposed as shown in FIG. 7. Then, a portion of the polycrystalline silicon film 30 and a portion of the silicon nitride film 31 corresponding to the laminate structure are removed by using the resist film 32 as a mask as shown in FIG. 8. Then, the resist film 32 is removed and, also the silicon dioxide film 25 is removed. The exposed portion of the polycrystalline silicon film 30 is then oxidized by selective thermal oxidation to form a silicon dioxide film 33 as shown in FIG. 9, and then the silicon nitride film 31 is removed. Subsequently, as shown in FIG. 10, unnecessary portions of the polycrystalline silicon film 30 not covered with a resist mask, not shown, are removed by etching. The resist mask is formed so as to cover the silicon dioxide film 33, so that the silicon dioxide film 33 serves as an etching mask in etching the polycrystalline silicon film 30 and a portion of the polycrystalline silicon 30 remains along an emitter region 34 in a width substantially equal to the thickness thereof (a portion on the right-hand side of the emitter region 34 in FIG. 10). Since this etching process did not use photolithography, a base electrode could be formed in a width smaller than that capable of being formed by photolithography by a portion of the polycrystalline silicon film 30 and without positional and dimensional errors, which might otherwise be produced when photolithography schemes are used instead. After forming a base 73 by doping a portion of the epitaxial layer 22 with B by ion implantation, a tungsten (W) film 35 is deposited only over the exposed surfaces of the polycrystalline silicon film 30 by using a mixed gas of monosilane (SiH$_4$) and tungsten hexafluoride (WF$_6$) at a temperature in the range of 250° C. to 300° C.

Figure 11:
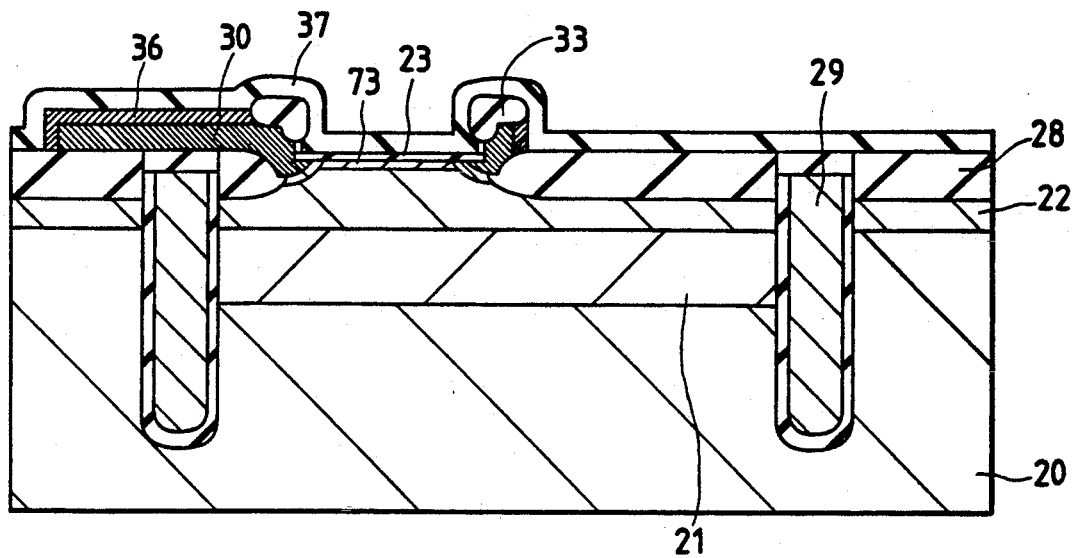
Figure 12:
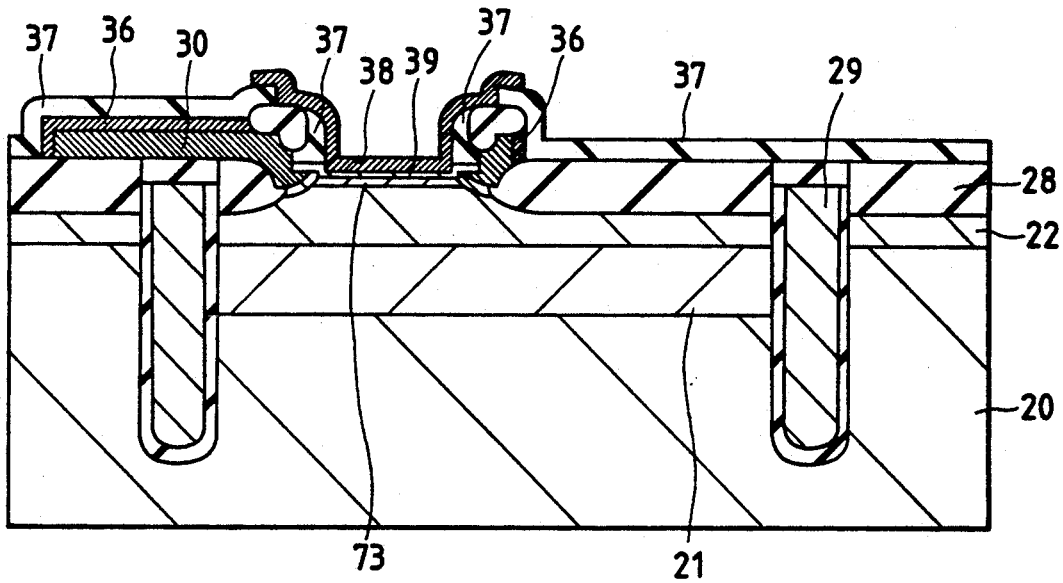

After forming the tungsten film 35, the structure is subjected to heat treatment in a hydrogen atmosphere at a temperature in the range of 700° C. to 900° C. to form a tungsten silicide film 36 as shown in FIG. 11, and then a silicon dioxide film 37 is formed over the entire surface of the structure by a known CVD process. Subsequently, as shown in FIG. 12, a resist mask, not shown, is formed over the silicon dioxide film 37 and then the silicon dioxide film 37 becomes subjected to anisotropic etching to remove a portion of the silicon dioxide film 37, in the emitter region 34 together with a portion of the silicon dioxide film 23 underlying the portion of the silicon dioxide film 37, leaving a portion of the silicon dioxide film 37 formed over the side surface of a step in the emitter region 34.

Figure 13:
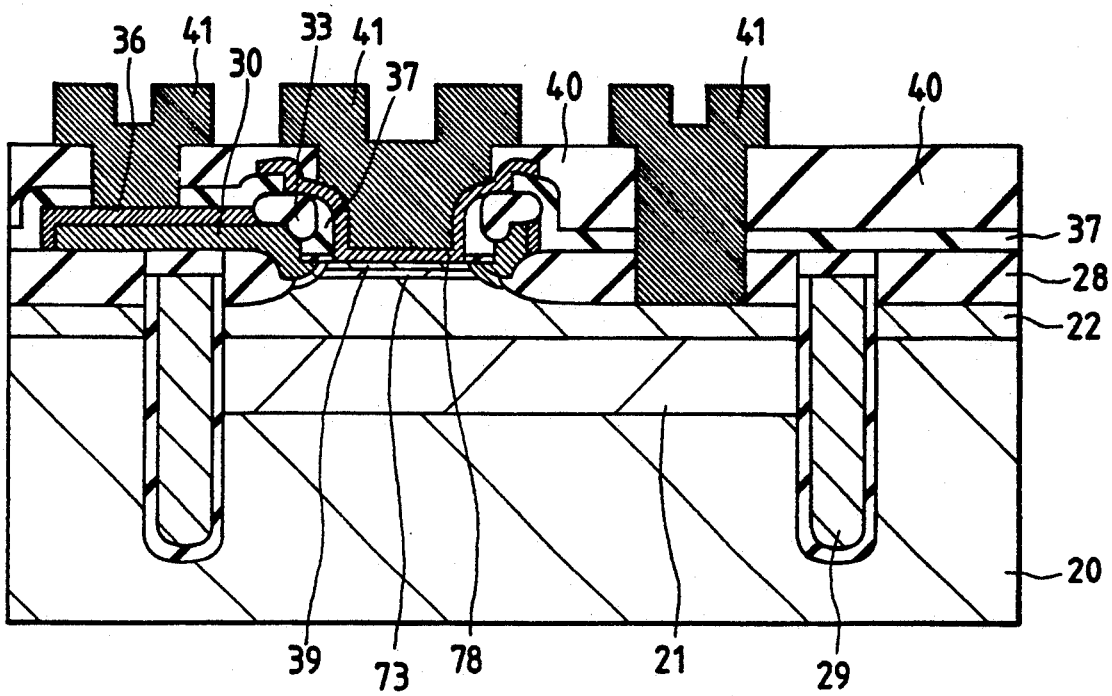

Then, a polycrystalline silicon film 38 is deposited, arsenic (As) is diffused in the polycrystalline silicon film 38 to form an emitter region 39, the surface of the structure is covered with a protective film 40, i.e., a silicon dioxide film, contact holes are formed in the protective film 40, and then aluminum electrodes 41 are formed in the contact holes as shown in FIG. 13.

Figure 14A:
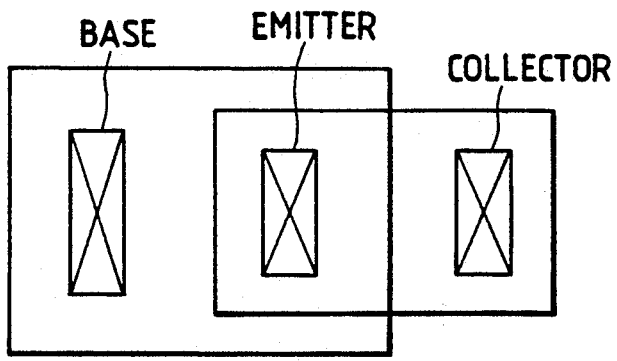
FIGS. 14a and 14b are diagrammatic views of assistance in explaining the effect of the present invention.
Figure 14B:
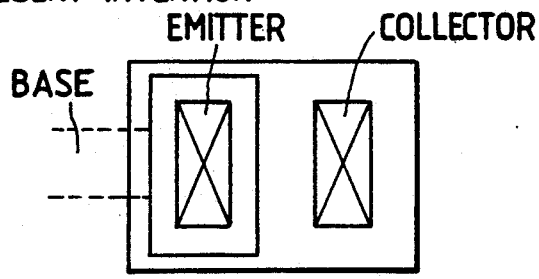

The external base resistance of the bipolar transistor of the present invention thus fabricated by the foregoing method becomes about 1/10 of that of the conventional bipolar transistor. Since the base electrode can be used as a part of wiring, the area of the bipolar transistor of the present invention becomes about ½ of that of the conventional bipolar transistor, which is clearly ideal from a comparative observation of FIG. 14a showing an essential portion of the conventional bipolar transistor in a plan view and FIG. 14b showing a corresponding portion of the bipolar transistor of the present invention in a plan view.

Second Embodiment

Figure 15:
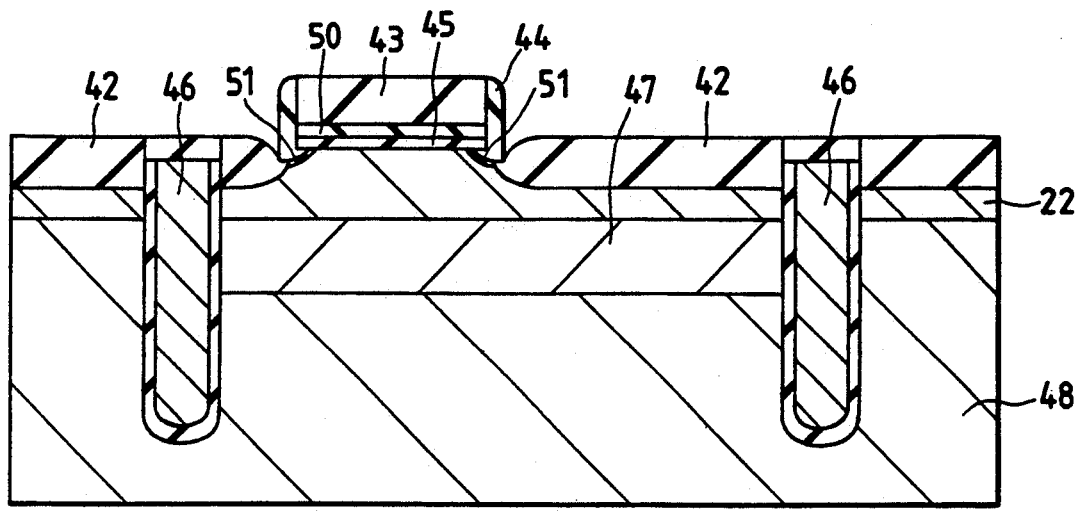
FIGS. 15 to 21 are sectional views of a completion of different processing steps of a method of fabricating a bipolar transistor in a second embodiment according to the present invention.

A structure shown in FIG. 15 is obtained by the processes described with reference to FIGS. 2 to 5. The structure shown in FIG. 15 has a silicon dioxide film 42, a silicon dioxide film 43, a silicon nitride film 44, a silicon dioxide film 45, isolating grooves 46, heavily doped collector region 47, a p-type silicon substrate 48, a lightly doped n-type epitaxial layer 49, a silicon nitride film 50 and a silicon dioxide film 51.

Figure 16:
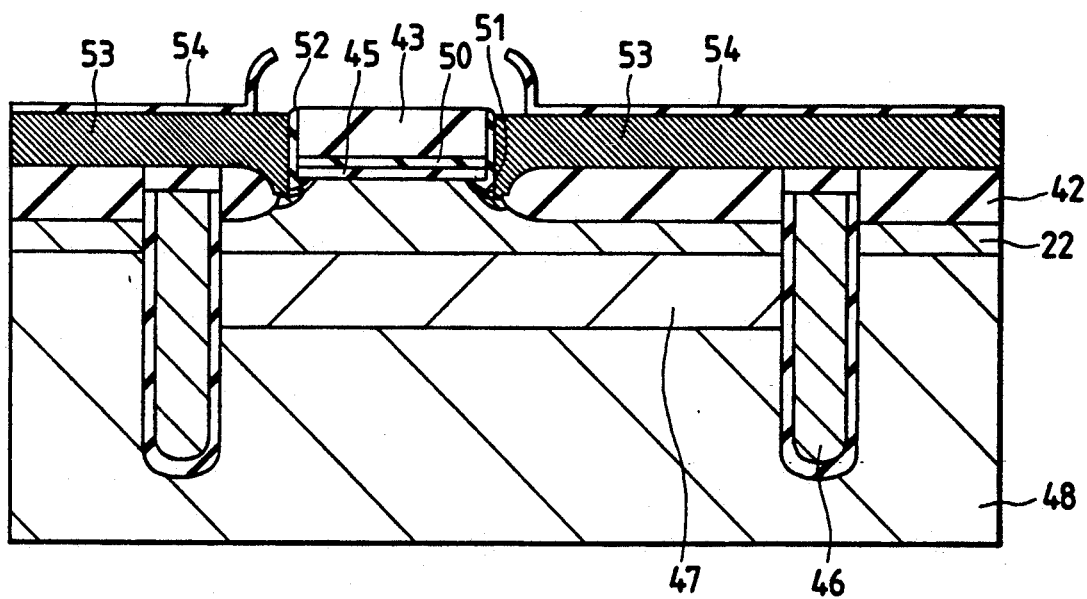

After removing the silicon nitride film 44, a silicon nitride film 52 is deposited over the entire surface of the structure, and the silicon nitride film 52 is subjected to anisotropic etching thereby leaving portions of the silicon nitride film 52 only over the side surfaces of the insulating films, i.e., the silicon dioxide films 43 and 45, and the silicon nitride film 50, as shown in FIG. 16. After removing a portion of the silicon dioxide film 51, a polycrystalline silicon film 53 and a silicon nitride film 54 are formed sequentially in that order, and then a portion of the polycrystalline silicon film 53 formed on the silicon dioxide film 42 is removed by the same process as that employed in fabricating the first embodiment.

Figure 17:
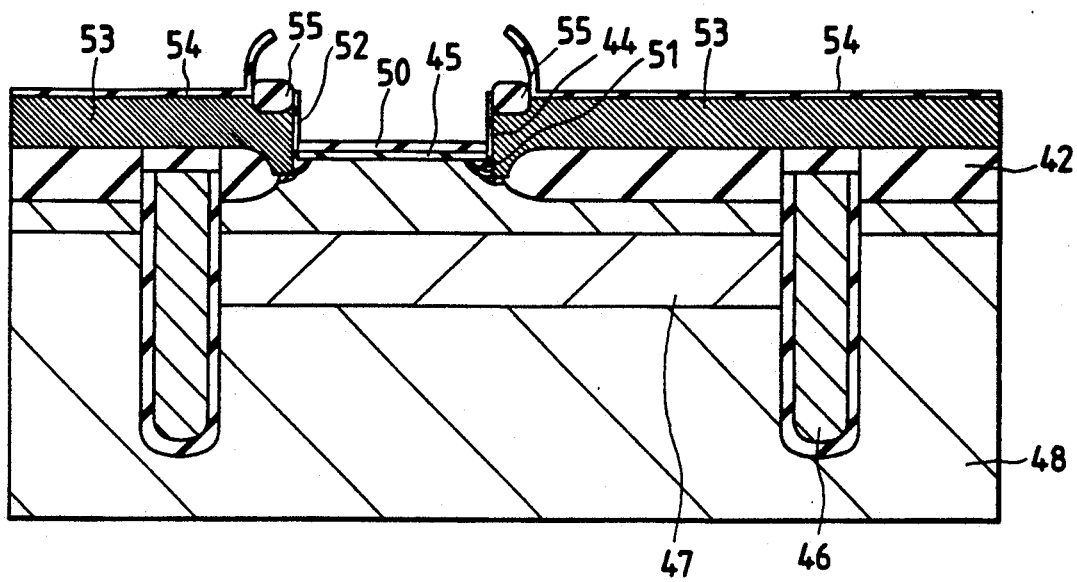
Figure 18:
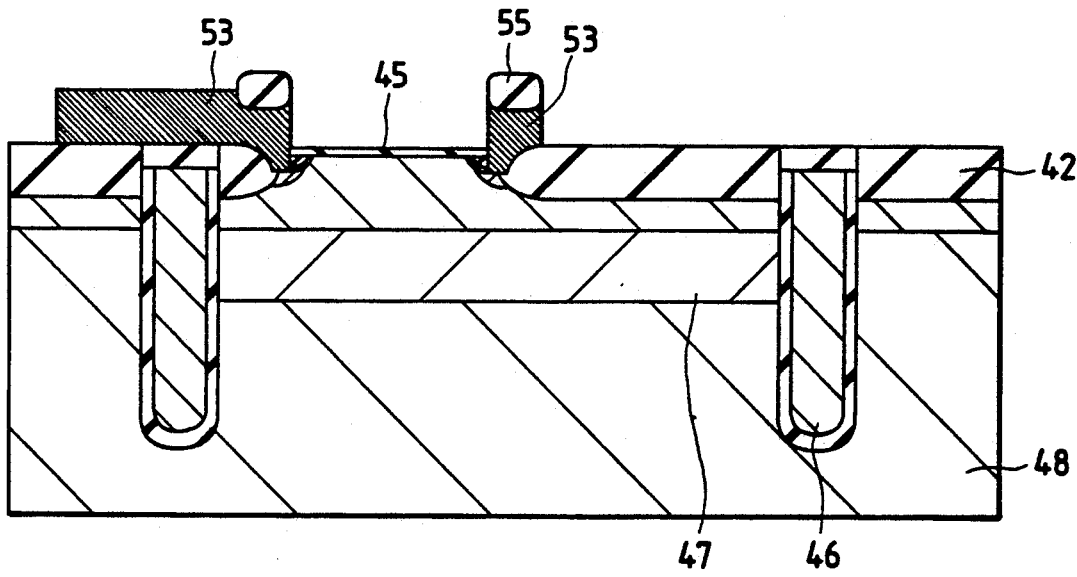
Figure 19:
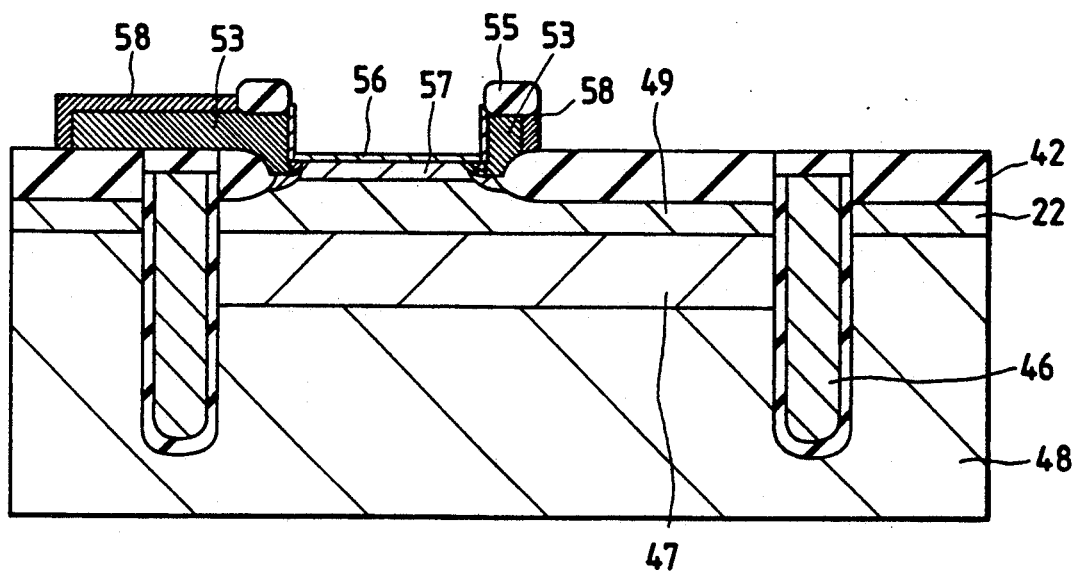

Then, as shown in FIG. 17, the silicon dioxide film 43 is removed and the thus far completed structure is subjected to thermal oxidation to form a silicon dioxide film 55 of a small width over the surface of a portion of the polycrystalline silicon film 53 not covered with the silicon nitride films 52 and 54. Since the side and upper surfaces of the exposed portion of the polycrystalline silicon film 53 are covered with the silicon nitride films 52 and 54, respectively the silicon dioxide film 55 does not overhang. As shown in FIG. 18, the silicon nitride films 50 and 54 are then removed and unnecessary portions of the polycrystalline silicon film 53 are removed selectively by using a resist mask by the same process as that employed in fabricating the bipolar transistor in the first embodiment. After removing the silicon dioxide film 45, the structure is subjected to thermal oxidation to form a thin silicon dioxide film 56 of 20 nm in thickness on the surface of the epitaxial layer 49 and the side surface of the polycrystalline silicon film 53 as shown in FIG. 19. Then, the structure is subjected to a known B ion implanting process to form a base region 57, and the thin silicon dioxide film 56 is removed by a known photolithographic etching process, leaving portions thereof covering the surface of the base region 57 and the side surface of the polycrystalline silicon film 53 on the side of the emitter region. Then, a tungsten silicide film 58 is formed over the exposed surface of the polycrystalline silicon film 53 by the same process as that employed according to the method for fabricating the bipolar transistor in the first embodiment.

Figure 20:
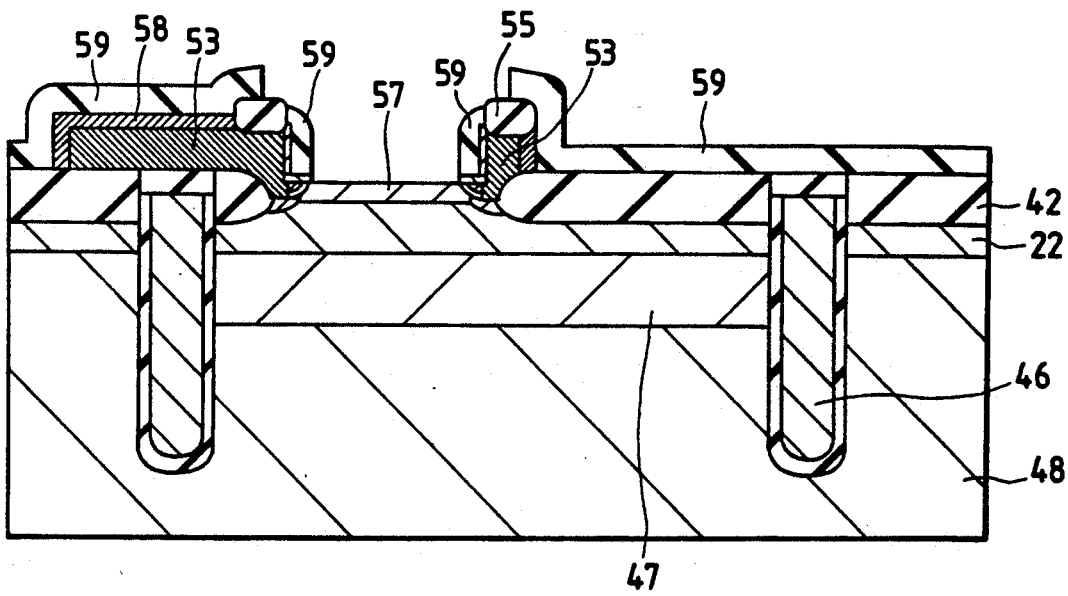

Subsequently, as shown in FIG. 20, a silicon dioxide film 59 is formed over the surface of the structure by a known CVD process. A portion of the silicon dioxide film 59 formed on the base region 57 is then removed by an anisotropic dry etching using a resist mask, not shown, leaving a portion of the same formed on the side surface of the polycrystalline silicon film 53.

Figure 21:
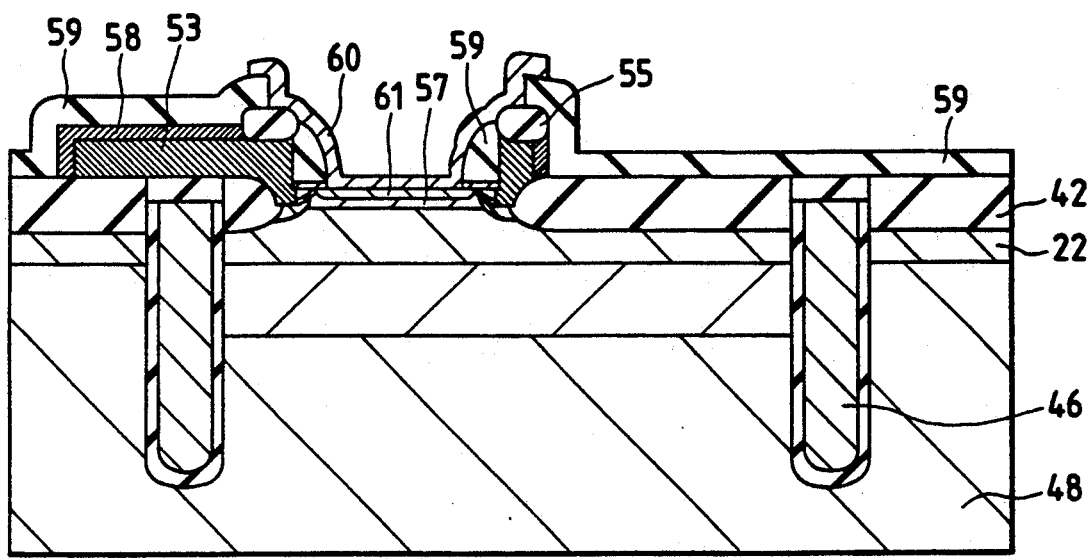

Then, as shown in FIG. 21, a polycrystalline silicon film 60 is formed, the polycrystalline silicon film 60 is then doped with As by ion implantation, and As is diffused by heat treatment to form an emitter region 61. Then, a protective film and aluminum electrodes are formed by the same processes as those employed in fabricating the bipolar transistor in the first embodiment to complete the bipolar transistor in the second embodiment.

In the bipolar transistor in the second embodiment, the silicon dioxide film 55 formed by oxidizing the surface of the polycrystalline silicon film 53 does not overhang. Therefore, the area of the emitter region 61 is not reduced. For example, if the thickness of the silicon dioxide film formed by oxidizing the surface of the polycrystalline silicon film 53 is 400 nm, it is possible, in fabricating the bipolar transistor of the first embodiment, the silicon dioxide film overhang might be 200 nm from the opposite sides of the emitter region to reduce the width of the emitter region by 400 nm. In this embodiment, the size of the emitter region is hardly reduced, and a bipolar transistor having improved characteristics is obtained.

Third Embodiment

Figure 22:
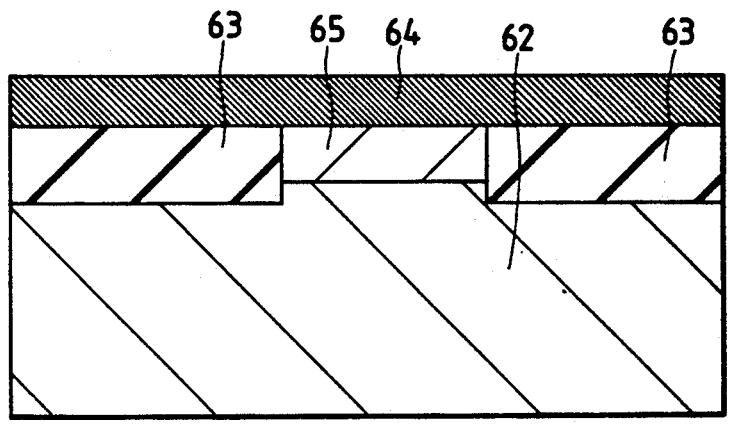
Figure 23:
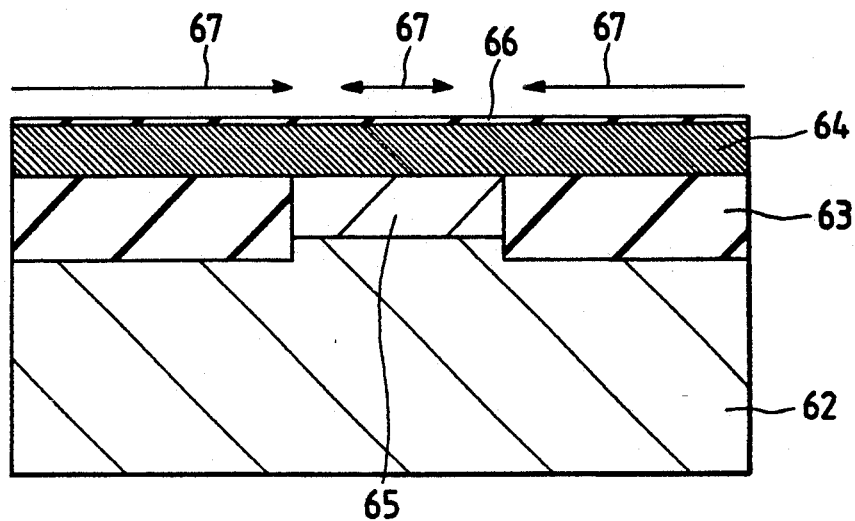
Figure 24:
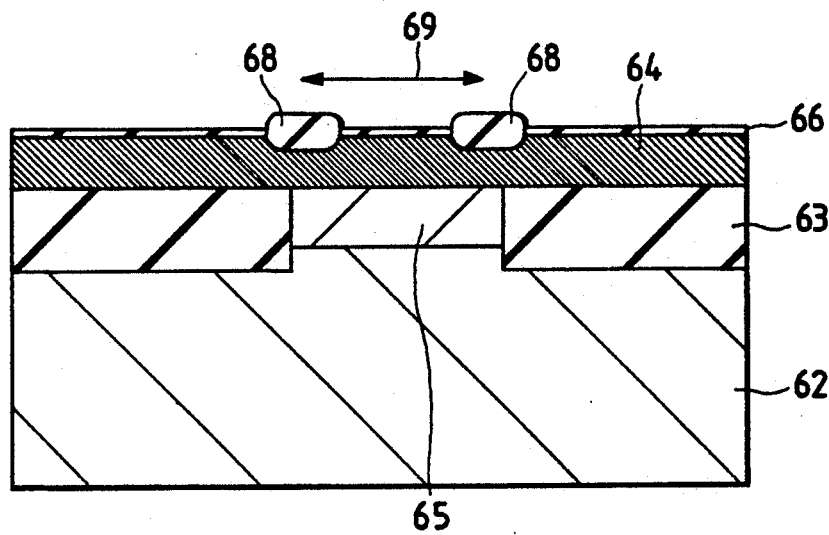
Figure 27:
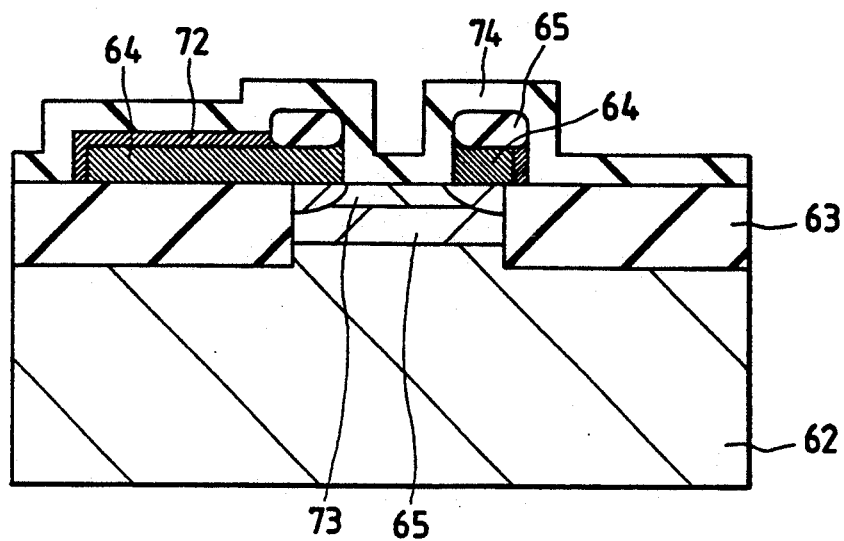
Figure 28:
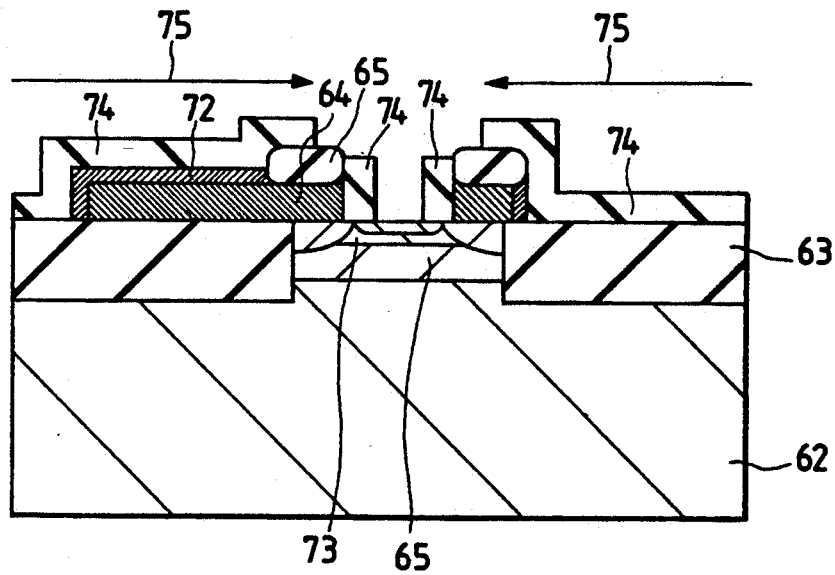
Figure 29:
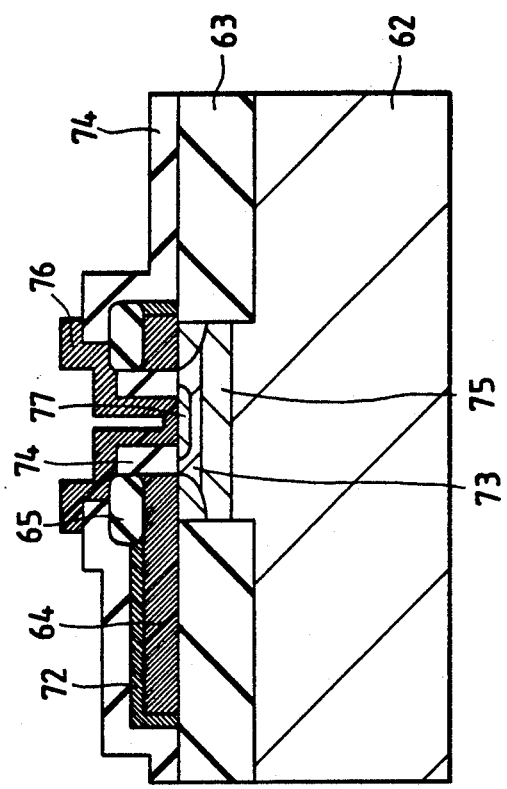

Referring to FIG. 22, after forming a collector region 65 and an isolating oxide film 63, a polycrystalline silicon film 64 is formed over the surface of a structure. Then, as shown in FIG. 23, a silicon nitride film 66 is deposited over the surface of the polycrystalline silicon film 64 and portions of the silicon nitride film 66 other than those indicated by the arrows 67 are removed. Then, as shown in FIG. 24, the surfaces of the exposed portions of the polycrystalline silicon film 64 are oxidized by thermal oxidation to form silicon dioxide films 68. B is then introduced into the polycrystalline silicon film 64 by ion implantation to form a p-type polycrystalline silicon film 64. Then, as shown in FIG. 25, the polycrystalline silicon film 64 other than a portion thereof indicated by the arrow 70 covered with a mask, not shown, is removed. The mask is formed so as to overlap the silicon oxide film 68 partially to leave a portion of the polycrystalline silicon film 64 underlying the silicon dioxide film 68. A silicon dioxide film 71 is formed in a thickness in the range of 20 to 50 nm over the surfaces of the collector region 65 and the polycrystalline silicon film 64, and then portions of the silicon dioxide film 71 other than a portion thereof covering a recess surrounded by the polycrystalline silicon film 64 are removed. A tungsten silicide film 72 is formed over the exposed surface of the polycrystalline silicon film 64 as shown in FIG. 26 by the same process as that employed in the methods of fabricating the bipolar transistors in the first and second embodiments. The collector region 65 of single crystal silicon is doped with B by ion implantation to form a base region 73. A silicon dioxide film 74 is formed over the surface of the structure as shown in FIG. 27 and unnecessary portions of the silicon dioxide film 74 are removed by photolithographic etching using a mask covering regions indicated by the arrows 75 and having an opening corresponding to an active region as shown in FIG. 28. Then, as shown in FIG. 29, an n-type polycrystalline silicon film 76 heavily doped with As is formed and the As is then diffused in the base region 73 by heat treatment to form an emitter region 77.

The method of fabricating the bipolar transistor in the third embodiment is simpler than those of fabricating the bipolar transistors in the first and second embodiments; however, the performance of the bipolar transistor in the third embodiment is substantially the same as that of the bipolar transistors in the first and second embodiments.

Fourth Embodiment

Figure 30:
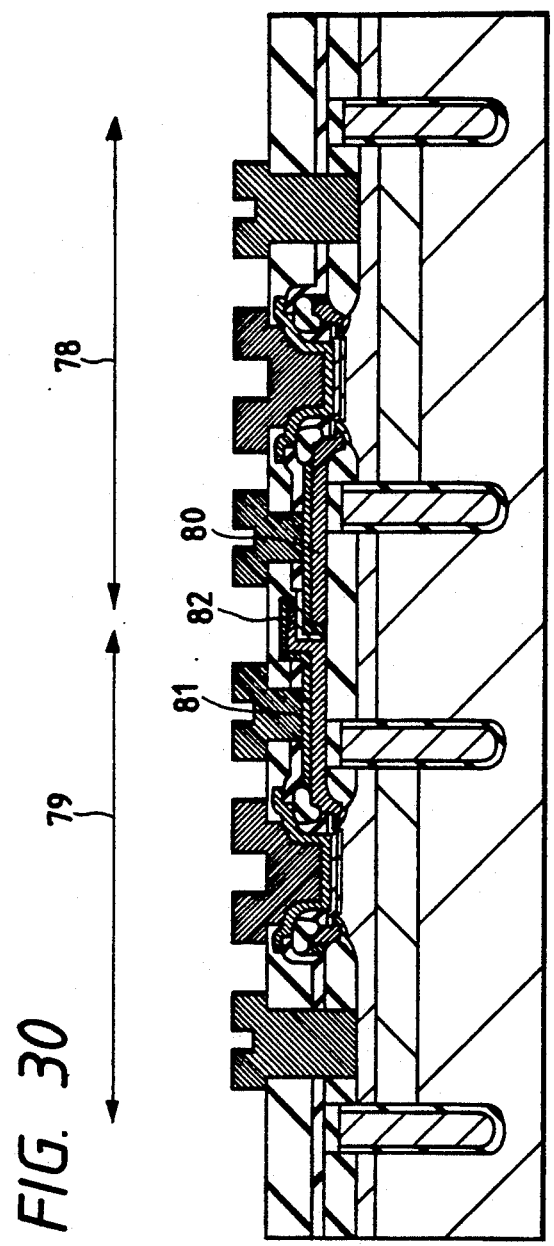
FIG. 30 is a sectional view of a bipolar transistor in a fourth embodiment according to the present invention.

In the fourth embodiment, the base electrode 80 of an npn transistor 78 and the base electrode 81 of a pnp transistor 79 are coupled by a capacitor 82, as shown in FIG. 30. Since the base electrodes 80 and 81 are formed by a silicide film having a small resistance, the capacitor 82 can be formed by sandwiching a thin silicon dioxide film between a silicide film and a polycrystalline silicon film without using any metal wiring. The capacitance can be increased by using a silicon nitride film or a tantalum oxide film instead of the silicon dioxide film.

Fifth Embodiment

Figure 31:
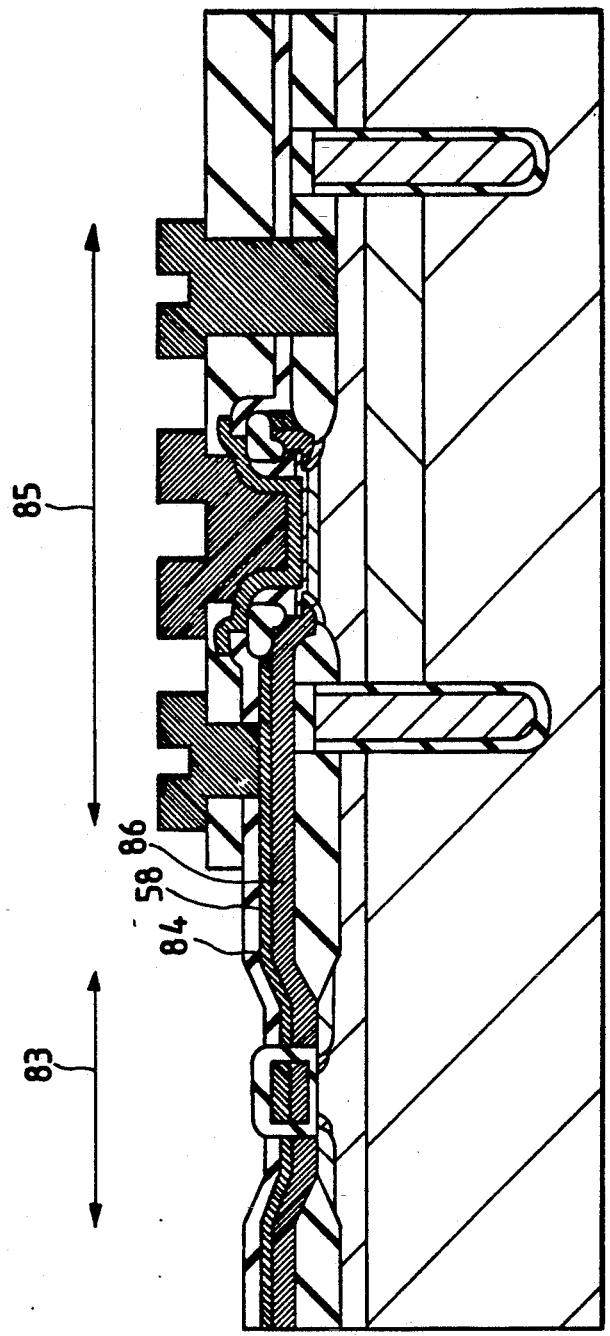
FIG. 31 is a sectional view of a bipolar transistor in a fifth embodiment according to the present invention.

In the fifth embodiment, the drain electrode 84 of a MOS transistor 83 and the base electrode 86 of a bipolar transistor 85 are connected directly by a laminate silicide/polycrystalline silicon layer 58 as shown in FIG. 31 without using any metal wiring, such as an aluminum wiring line. Therefore, the degree of integration of a LSI, such as BiCMOS LSIs, provided with both bipolar transistors, and MOS transistors can be doubled.

Sixth Embodiment

Figure 32:
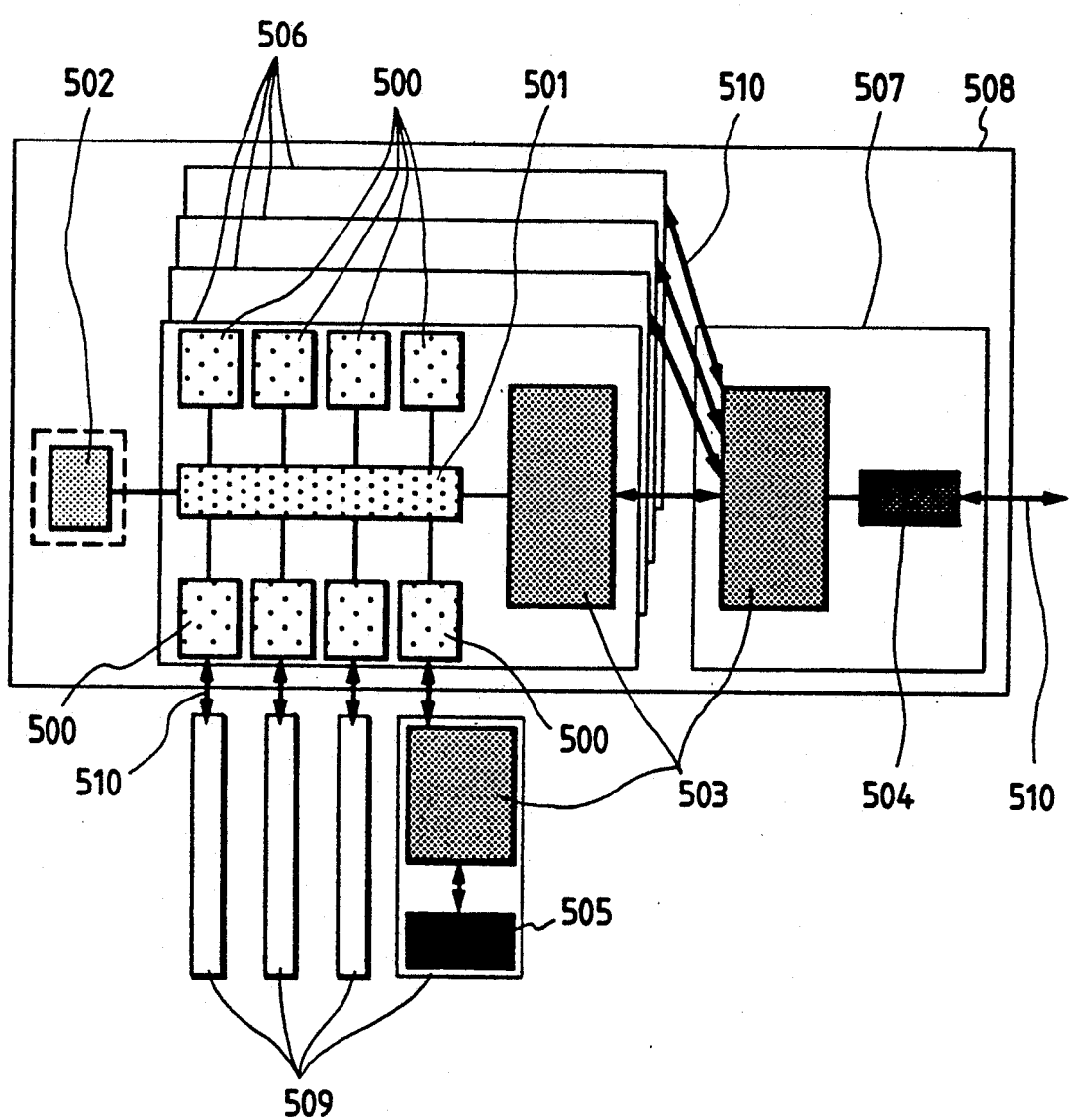
FIG. 32 is a sectional view of a bipolar transistor in a sixth embodiment according to the present invention.

The sixth embodiment is the application of semiconductor integrated circuits to a high-speed large-scale computer provided with a plurality of parallel processors 500 that perform data processing functions as shown in FIG. 32. Since the high-speed semiconductor integrated circuits embodying the present invention have a high degree of integration, the processors 500 that execute instructions and calculation, a storage control unit 501, a main storage device 502 and the associated components can be fabricated on a semiconductor substrate, i.e., a silicon substrate, in a chip having sides each of a length in the range of 10 to 30 mm. The processors 500, the storage control unit 501 and a data communication interface 503 comprising compound semiconductor integrated circuits were fabricated on ceramic substrates 506. A data communication interface 503 and a data communication control unit 504 were fabricated on a ceramic substrate 507. A central processing unit 508 for a large-scale computer is constructed by mounting the ceramic substrates 506, the ceramic substrate 507 and a ceramic substrate carrying the main storage unit 502 on a substrate having sides each of about 50 cm or less. Data communication within the central processing unit 508, data communication between a plurality of central processing units or data communication between the data communication interfaces 503 and I/O processors 505 mounted on substrates 509 is performed through optical fibers 510 indicated by double-head arrows in FIG. 32. In this large-scale computer, the semiconductor integrated circuits including the processors 500, the storage control units 501 and the main storage unit 502 perform high-speed parallel operations. The use of light as a data communication medium enhance the throughput of the large-scale computer greatly.

The metal silicide may be a silicide of W, Ti, Ta, Mo, Ni, Co, Cu, Pt, Pd, Zr, Hf, Mn, In, Rh, V or Nb.

As is apparent from the foregoing description, according to the present invention, the resistance of the base of an npn transistor could be reduced to about a half. Since any opening for connecting the base and metal wiring need not be formed and any tolerance of alignment of the active region and the base electrode of the transistor is not necessary, the area of the transistor becomes 1/5 or less of the area of the conventional transistor. The metal silicide electrode serves as wiring without using any metal wiring, and the degree of integration of an LSI employing the transistors of the present invention is twice that of an LSI employing conventional transistors.

What is claimed is:
1. A semiconductor device comprising:
a single crystalline semiconductor substrate;
a first region of a first conductivity type disposed over a surface region of said semiconductor substrate;
a second region of a second conductivity type, opposite to said first conductivity type, formed at an upper surface of said first region;
a third region of said second conductivity type formed in contact with a lower surface of said first region;
a first insulating film formed above a main surface of said semiconductor substrate and having a window through which an upper surface of said second region is exposed for electrical contact;
an electrode region formed on said first insulating film to surround said first region such that said electrode region is electrically connected with an exposed part of said first region,
wherein said electrode region includes a first part extended on an upper surface of said first insulating film from a first portion of said exposed part of said first region and a second, different part electrically connected with a second portion of said exposed part of said first region;
a second insulating film formed on said electrode region;
an electrode electrically connected with an upper surface of a predetermined portion of said first part of said electrode region through a second window formed in said second insulating film,
wherein said second part of said electrode region has a width substantially equal to the thickness of said electrode region in said first part thereof; and
a metal silicide film disposed on an upper surface of said first part of said electrode region.

2. A semiconductor device according to claim 1, wherein said first region, said second region and said third region comprise a base, an emitter and collector, respectively, of a bipolar transistor.

3. A semiconductor device according to claim 1, wherein said electrode region comprises a polycrystalline silicon film.

4. A semiconductor device according to claim 1, wherein said metal silicide is one selected from a group consisting of tungsten silicide, titanium silicide, tantalum silicide, molybdenum silicide, cobalt silicide, copper silicide, platinum silicide, zirconium silicide, hafnium silicide, manganese silicide, iridium silicide, vanadium silicide and niobium silicide.

5. A semiconductor device according to claim 1, wherein said second part of said electrode region has a substantially constant width with respect to a plane view.

6. A semiconductor device according to claim 1, wherein said metal silicide film is disposed on an upper surface and one of side surfaces of said first part of said electrode region.

7. A semiconductor device according to claim 1, wherein said metal silicide film is disposed on one of side surfaces of said second part of said electrode region.

8. A semiconductor device according to claim 2, wherein said electrode region comprises a polycrystalline silicon film.

9. A semiconductor device according to claim 2, wherein said metal silicide is one selected from a group consisting of tungsten silicide, titanium silicide, tantalum silicide, molybdenum silicide, cobalt silicide, copper silicide, platinum silicide, zirconium silicide, hafnium silicide, manganese silicide, iridium silicide, vanadium silicide and niobium silicide.

10. A semiconductor device according to claim 2, wherein said second part of said electrode region has a substantially constant width with respect to a plane view.

11. A semiconductor device according to claim 2, wherein said metal silicide film is disposed on an upper surface and one of side surfaces of said first part of said electrode region.

12. A semiconductor device according to claim 2, wherein said metal silicide film is disposed on one of side surfaces of said second part of said electrode region.

13. A semiconductor device according to claim 1, wherein said first region, said second region and said third region are formed in an epitaxial layer.

14. A semiconductor device according to claim 13, wherein said electrode region comprises a polycrystalline silicon film.

15. A semiconductor device according to claim 8, wherein said metal silicide is one selected from a group consisting of tungsten silicide, titanium silicide, tantalum silicide, molybdenum silicide, cobalt silicide, copper silicide, platinum silicide, zirconium silicide, hafnium silicide, manganese silicide, iridium silicide, vanadium silicide and niobium silicide.

16. A semiconductor device according to claim 15, wherein said second part of said electrode region has a substantially constant width with respect to a plane view.

17. A semiconductor device according to claim 16, wherein said metal silicide film is disposed on an upper surface and one of side surfaces of said first part of said electrode region.

18. A semiconductor device according to claim 17, wherein said base, said emitter and said collector are formed in an epitaxial layer.

19. A semiconductor device according to claim 18, wherein said first and second conductivity types are p-type and n-type, respectively.

20. A semiconductor device according to claim 16, wherein said metal silicide film is disposed on one of side surfaces of said second part of said electrode region.

21. A semiconductor device according to claim 20, wherein said base, said emitter and said collector are formed in an epitaxial layer.

22. A semiconductor device according to claim 21, wherein said first and second conductivity types are p-type and n-type, respectively.

23. A semiconductor device comprising:
a semiconductor body;
a first region of a first conductivity type disposed at a main surface region of said semiconductor body;
a second region of a second conductivity type, opposite to said first conductivity type, formed at an upper surface of said first region;
a third region of said second conductivity type formed in contact with a lower surface of said first region;
a first insulating film formed on said main surface of said semiconductor body and having a window through which an upper surface of said second region is exposed for electrical contact;
an electrode region formed on said first insulating film to surround said first region such that said electrode region is electrically connected with an exposed part of said first region,
wherein said electrode region includes a first part extended on an upper surface of said first insulating film from a first portion of said exposed part of said first region and a second part electrically connected with a second portion of said exposed part of said first region, said second part of said electrode region having a width which is substantially less than that of said first part thereof;
a second insulating film formed on said electrode region;
an electrode electrically connected with an upper surface of a predetermined portion of said first part of said electrode region through a second window formed in said second insulating film,
wherein said second part of said electrode region has a width substantially equal to the thickness of said electrode region in said first part thereof; and
a metal silicide film disposed on an upper surface of said first part of said electrode region.

24. A semiconductor device according to claim 23, wherein said first region, said second region and said third region are base, emitter and collector of a bipolar transistor, respectively, and are provided in an isolated island region in said semiconductor body.

25. A semiconductor device according to claim 24, wherein said electrode region comprises a polycrystalline silicon film.

26. A semiconductor device according to claim 25, wherein said metal silicide is one selected from a group consisting of tungsten silicide, titanium silicide, tantalum silicide, molybdenum silicide, cobalt silicide, copper silicide, platinum silicide, zirconium silicide, hafnium silicide, manganese silicide, iridium silicide, vanadium silicide and niobium silicide.

27. A semiconductor device according to claim 26, wherein said second part of said electrode region has a substantially constant width with respect to a plane view.

28. A semiconductor device according to claim 27, wherein said metal silicide film is disposed on an upper surface and one of side surfaces of said first part of said electrode region.

29. A semiconductor device according to claim 27, wherein said metal silicide film is disposed on one of side surfaces of said second part of said electrode region.

30. A semiconductor device according to claim 28, wherein said semiconductor body includes a semiconductor substrate and an epitaxial layer thereon, and wherein said base, emitter and collector regions are formed in said epitaxial layer.

31. A semiconductor device according to claim 29, wherein said semiconductor body includes a semiconductor substrate and an epitaxial layer thereon, and wherein said base, emitter and collector regions are formed in said epitaxial layer.

* * * * *